(12) United States Patent
Lee et al.

(10) Patent No.: US 11,735,562 B2
(45) Date of Patent: Aug. 22, 2023

(54) SENSOR PACKAGE STRUCTURE

(71) Applicant: KINGPAK TECHNOLOGY INC., Hsin-Chu County (TW)

(72) Inventors: Chien-Chen Lee, Hsin-Chu County (TW); Chen-Pin Peng, Hsin-Chu County (TW)

(73) Assignee: TONG HSING ELECTRONIC INDUSTRIES, LTD., Taipei (TW)

( * ) Notice: Subject to any disclaimer, the term of this patent is extended or adjusted under 35 U.S.C. 154(b) by 386 days.

(21) Appl. No.: 17/205,463

(22) Filed: Mar. 18, 2021

(65) Prior Publication Data

US 2022/0254752 A1 Aug. 11, 2022

(30) Foreign Application Priority Data

Feb. 8, 2021 (TW) .................................. 110104619

(51) Int. Cl.
*H02H 1/00* (2006.01)
*H01L 23/00* (2006.01)

(52) U.S. Cl.
CPC .............. *H01L 24/85* (2013.01); *H01L 24/48* (2013.01); *H01L 2224/48227* (2013.01)

(58) Field of Classification Search
None
See application file for complete search history.

(56) References Cited

U.S. PATENT DOCUMENTS

| 5,205,463 | A | 4/1993 | Holdgrafer et al. |
| 6,561,411 | B2 | 5/2003 | Lee |
| 7,475,802 | B2 | 1/2009 | Yajima |
| 9,812,423 | B2* | 11/2017 | Fukue ..................... H01L 24/48 |
| 10,411,055 | B2* | 9/2019 | Chuang ................... H01L 23/10 |
| 2004/0080037 | A1 | 4/2004 | Foong et al. |
| 2007/0063135 | A1* | 3/2007 | Chen ..................... H01L 23/057 |
| | | | 250/239 |

(Continued)

FOREIGN PATENT DOCUMENTS

TW 201803040 A 1/2018

OTHER PUBLICATIONS

Teoh Eng Kang; Alastair Attard; Jonathan Abela. "CMOS Image Sensor Packaging Technology for Automotive Applications," iMAPS MiNaPAD 2019.

*Primary Examiner* — Stephen W Jackson
(74) *Attorney, Agent, or Firm* — Li & Cai Intellectual Property (USA) Office (57) ABSTRACT

A sensor package structure is provided. The sensor package structure includes a substrate, a sensor chip disposed on the substrate, a plurality of electrical connection members electrically connecting the sensor chip to the substrate, a supporting adhesive layer formed on the sensor chip, and a light-permeable sheet disposed on the supporting adhesive layer. Each of the electrical connection members includes a head solder disposed on a connecting pad of the sensor chip, a wire having a first end and a second end, and a tail solder. The first end of the wire extends from the head solder so as to connect the second end onto a soldering pad of the substrate, and the wire has a first bending portion arranged adjacent to the head solder. The head solder and the first bending portion of each of the electrical connection members are embedded in the supporting adhesive layer.

10 Claims, 4 Drawing Sheets

(56) References Cited

U.S. PATENT DOCUMENTS

2008/0265385 A1  10/2008  Tsai et al.
2009/0267170 A1  10/2009  Chien et al.
2018/0012919 A1   1/2018  Tu et al.

* cited by examiner

SENSOR PACKAGE STRUCTURE

CROSS-REFERENCE TO RELATED PATENT APPLICATION

This application claims the benefit of priority to Taiwan Patent Application No. 110104619, filed on Feb. 8, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a sensor package structure, and more particularly to a sensor package structure in a wire bonding manner.

BACKGROUND OF THE DISCLOSURE

A wire bonding manner for a conventional sensor package structure includes a normal bond and a reverse bond. The conventional sensor package structure formed in the normal bond manner would have a larger thickness, and the reliability of the conventional sensor package structure formed in the reverse bond manner would be reduced.

SUMMARY OF THE DISCLOSURE

In response to the above-referenced technical inadequacies, the present disclosure provides a sensor package structure to effectively improve on the issues associated with conventional sensor package structures.

In one aspect, the present disclosure provides a sensor package structure, which includes a substrate, a sensor chip, a plurality of electrical connection members, a supporting adhesive layer, and a light-permeable sheet. The substrate includes a chip bonding region and a plurality of soldering pads that are arranged outside of the chip bonding region. The sensor chip is disposed on the chip bonding region, and a top surface of the sensor chip has a sensing region and a plurality of connecting pads that are arranged outside of the sensing region. The electrical connection members respectively and electrically connect the connecting pads to the soldering pads. Each of the electrical connection members includes a head solder, a wire, and a tail solder. The head solder is disposed on the corresponding connecting pad. The wire has a first end and a second end that is opposite to the first end. The first end of the wire extends from the head solder so as to connect the second end onto the corresponding soldering pad, and the wire has a first bending portion arranged adjacent to the head solder. The tail solder is fixed to the second end of the wire and the corresponding soldering pad. The supporting adhesive layer is formed on the top surface of the sensor chip and surrounds an outer side of the sensing region. For each of the electrical connection members, the head solder and the first bending portion of the wire are embedded in the supporting adhesive layer. The light-permeable sheet is disposed on the supporting adhesive layer. The light-permeable sheet, the supporting adhesive layer, and the top surface of the sensor chip jointly define an enclosed space.

In another aspect, the present disclosure provides a sensor package structure, which includes a substrate, a sensor chip, a plurality of electrical connection members, a supporting adhesive layer, and a light-permeable sheet. The substrate includes a chip bonding region and a plurality of soldering pads that are arranged outside of the chip bonding region. The sensor chip is disposed on the chip bonding region, and a top surface of the sensor chip has a sensing region and a plurality of connecting pads that are arranged outside of the sensing region. The electrical connection members respectively and electrically connect the connecting pads to the soldering pads. Each of the electrical connection members includes a head solder, a wire, and a tail solder. The head solder is disposed on the corresponding connecting pad. The wire has a first end and a second end that is opposite to the first end. The first end of the wire extends from the head solder so as to connect the second end onto the corresponding soldering pad. The tail solder is fixed to the second end of the wire and the corresponding soldering pad. The supporting adhesive layer is formed on the top surface of the sensor chip and surrounds an outer side of the sensing region. For each of the electrical connection members, the head solder and a portion of the wire are embedded in the supporting adhesive layer, and the portion of the wire has a highest point that is spaced apart from the substrate by a maximum distance. The light-permeable sheet is disposed on the supporting adhesive layer. The light-permeable sheet, the supporting adhesive layer, and the top surface of the sensor chip jointly define an enclosed space.

In yet another aspect, the present disclosure provides a sensor package structure, which includes a substrate, a sensor chip, a plurality of electrical connection members, a supporting adhesive layer, and a light-permeable sheet. The substrate includes a chip bonding region and a plurality of soldering pads that are arranged outside of the chip bonding region. The sensor chip is disposed on the chip bonding region, and a top surface of the sensor chip has a sensing region and a plurality of connecting pads arranged outside of the sensing region. The electrical connection members respectively and electrically connect the connecting pads to the soldering pads. Each of the electrical connection members includes a head solder, a wire, and a tail solder. The head solder is disposed on the corresponding connecting pad. The wire has a first end and a second end that is opposite to the first end. The first end of the wire extends from the head solder so as to connect the second end onto the corresponding soldering pad, and the wire has a first bending portion arranged adjacent to the head solder and a second bending portion that is arranged between the first bending portion and the second end. The tail solder is fixed to the second end of the wire and the corresponding soldering pad. The supporting adhesive layer is formed on the top surface of the sensor chip and surrounds an outer side of the sensing region. For each of the electrical connection members, the head solder and a portion of the wire are embedded in the supporting adhesive layer. The light-permeable sheet is disposed on the supporting adhesive layer. The light-permeable sheet, the supporting adhesive layer, and the top surface of the sensor chip jointly define an enclosed space.

In conclusion, the sensor package structure of the present disclosure can be formed with a thinner thickness and a better reliability via a structural design of the electrical connection members (e.g., the head solder and the first bending portion of each of the electrical connection members are embedded in the supporting adhesive layer; or, the portion of each of the wires embedded in the supporting adhesive layer has the highest point that is spaced apart from the substrate by the maximum distance; or, each of the wires has the first bending portion adjacent to the head solder and the second bending portion that is arranged between the first bending portion and the second end).

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Referring to FIG. 1 to FIG. 4, an embodiment of the present disclosure provides a sensor package structure 100. The sensor package structure 100 includes a substrate 1, a sensor chip 2 disposed on the substrate 1, a plurality of electrical connection members 3 electrically connecting the sensor chip 2 to the substrate 1, a supporting adhesive layer 4 formed on the sensor chip 2, a light-permeable sheet 5 disposed on the supporting adhesive layer 4, and a package body 6 that is formed on the substrate 1.

Though the sensor package structure 100 in the present embodiment is illustrated upon including the above components, but the sensor package structure 100 can be adjusted or modified according to design requirements. For example, in other embodiments not shown in the drawings of the present disclosure, the sensor package structure 100 can be provided without the package body 6.

Figure 1:
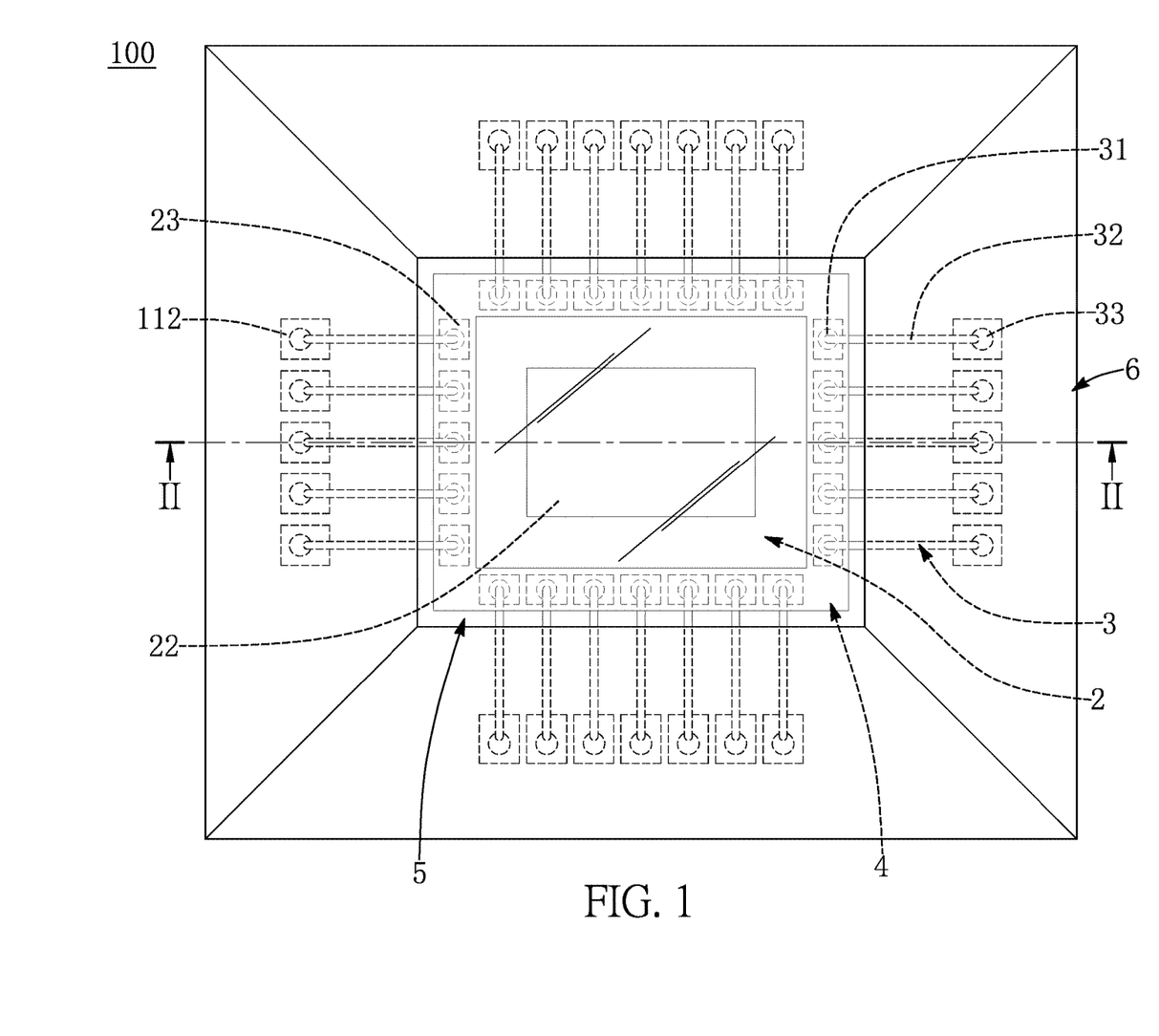
FIG. 1 is a top view of a sensor package structure according to an embodiment of the present disclosure.
Figure 2:
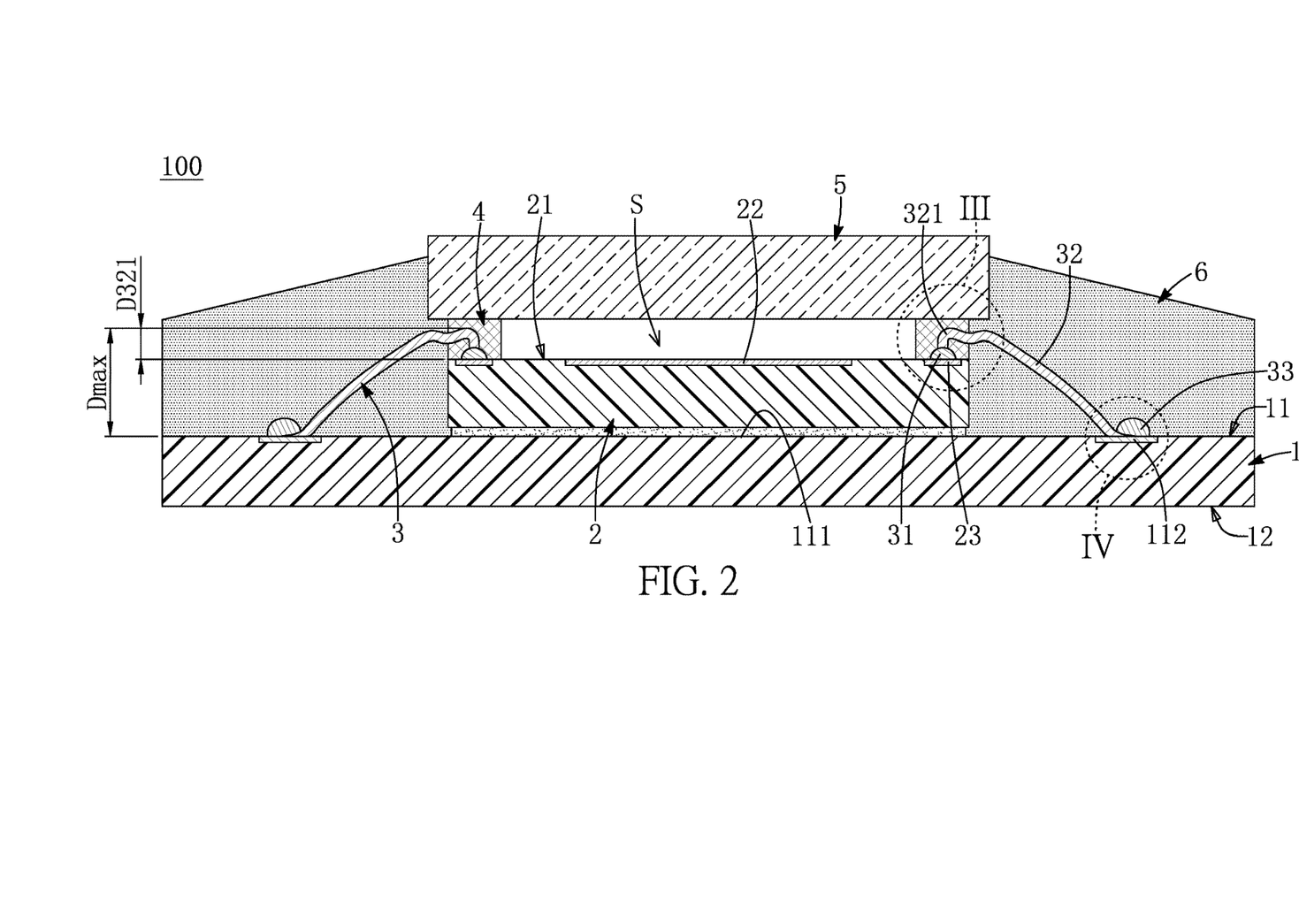
FIG. 2 is a cross-sectional view taken along line II-II of FIG. 1.

The substrate 1 in the present embodiment is in a square shape or a rectangular shape, but the present disclosure is not limited thereto. The substrate 1 has a first board surface 11 and a second board surface 12 that is opposite to the first board surface 11. The substrate 1 has a chip bonding region 111 and a plurality of soldering pads 112 that are arranged outside of the chip bonding region 111. In the present embodiment, the chip bonding region 111 is substantially arranged on a center portion of the first board surface 11, and the soldering pads 112 are formed on the first board surface 11 in a ring-shaped arrangement, but the present disclosure is not limited thereto.

In addition, the substrate 1 in the present embodiment can also be provided with a plurality of solder balls (not shown in the drawings) disposed on the second board surface 12. The sensor package structure 100 can be soldered onto or fixed onto an electronic component (not shown in the drawings) through the solder balls, thereby electrically connecting the sensor package structure 100 to the electronic component.

The sensor chip 2 in the present embodiment is an image sensor chip, but the present disclosure is not limited thereto. The sensor chip 2 is mounted on the chip bonding region 111 of the substrate 1. Moreover, a top surface 21 of the sensor chip 2 has a sensing region 22 and a plurality of connecting pads 23 that are arranged outside of the sensing region 22. Positions of the connecting pads 23 preferably correspond to those of the soldering pads 112, respectively. In the present embodiment, the connecting pads 23 surround the sensing region 22 in a substantially ring-shaped arrangement, but the present disclosure is not limited thereto.

For example, in other embodiments not shown in the drawings of the present disclosure, the connecting pads 23 can be arranged in two rows that are respectively located at two opposite sides of the sensing region 22, the soldering pads 112 can also be arranged in two rows that are respectively located at two opposite sides of the chip bonding region 111, and positions the connecting pads 23 respectively correspond to those of the soldering pads 112.

The electrical connection members 3 respectively and electrically connect the connecting pads 23 of the sensor chip 2 to the soldering pads 112 of the substrate 1. In other words, each of the electrical connection members 3 is connected to one of the connecting pads 23 and one of the soldering pads 112. Since the electrical connection members 3 in the present embodiment are of the substantially same structure, the following description only introduces the structure of single one electrical connection member 3, for the sake of brevity, but the present disclosure is not limited thereto. For example, in other embodiments not shown in the drawings of the present disclosure, the electrical connection members 3 can be of different structures.

Figure 3:
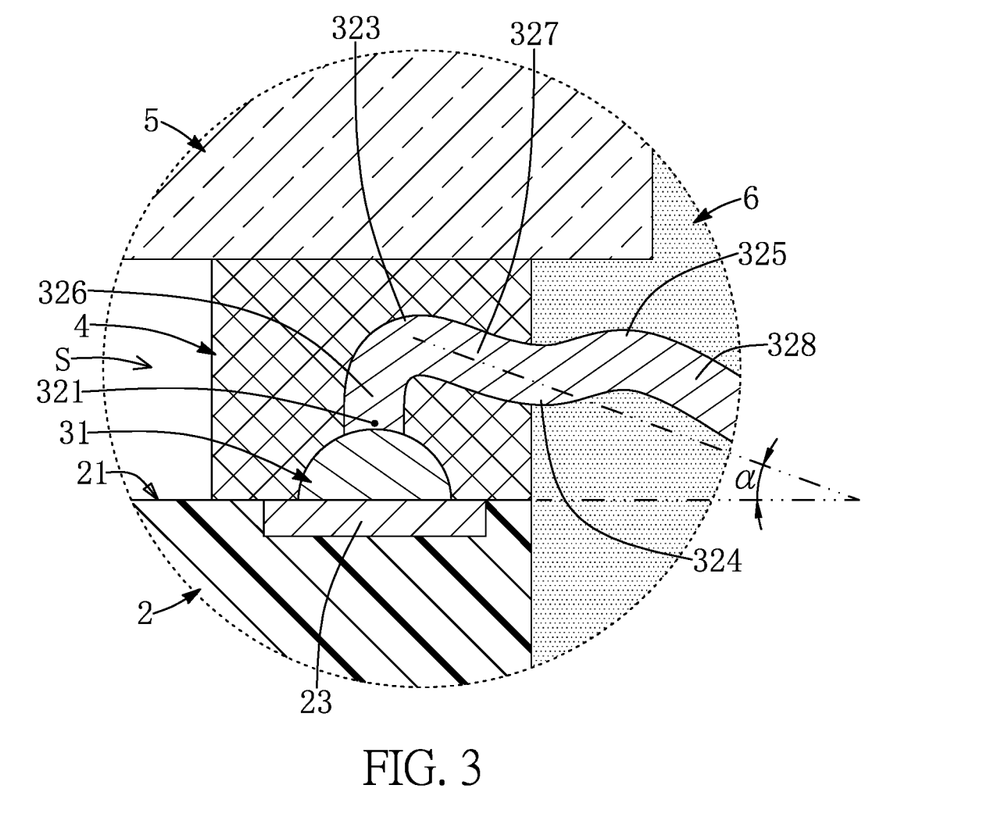
FIG. 3 shows an enlarged view of part III of FIG. 2.
Figure 4:
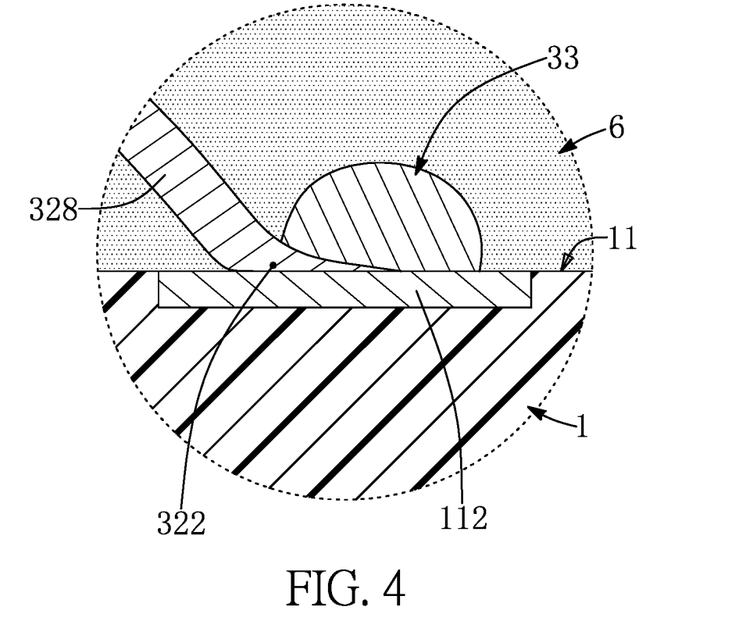
FIG. 4 shows an enlarged view of part IV of FIG. 2.

In the present embodiment, the electrical connection member 3 includes a head solder 31, a wire 32, and a tail solder 33. The head solder 31 is disposed on the corresponding connecting pad 23. The wire 32 has a first end 321 and a second end 322 that is opposite to the first end 321. The first end 321 of the wire 32 extends from the head solder 31 so as to connect the second end 322 onto the corresponding soldering pad 112. The tail solder 33 is fixed to the second end 322 of the wire 32 and the corresponding soldering pad 112.

Specifically, the wire 32 in the present embodiment has a first bending portion 323 arranged adjacent to the head solder 31 and a second bending portion 324 that is arranged between the first bending portion 323 and the second end 322. At the position of the first bending portion 323 (e.g., at the peak of the first bending portion 323), the wire 32 is spaced apart from the substrate 1 (e.g., the first board surface 11) by a maximum distance Dmax. In other words, a distance between the substrate 1 (e.g., the first board surface 11) and the other portion, other than the first bending portion 323, of the wire 32 is less than the maximum distance Dmax. It should be noted that a thickness of the sensor chip 2 can be adjusted or changed according to design requirements, but the first bending portion 323 (e.g., the peak) is preferably spaced apart from the top surface 21 of the sensor chip 2 by a distance D321 that is within a range from 50 μm to 100 μm.

In addition, the wire 32 in the present embodiment has a third bending portion 325 arranged between the second bending portion 324 and the second end 322, but the present disclosure is not limited thereto. For example, in other embodiments not shown in the drawings of the present disclosure, the wire 32 can further have at least one fourth bending portion between the third bending portion 325 and the second end 322.

From a different aspect, the wire 32 has a drawing segment 326 arranged between the first end 321 and the first bending portion 323, a traversing segment 327 arranged between the first bending portion 323 and the second bending portion 324, and a dropdown segment 328 that is arranged between the second bending portion 324 (or the third bending portion 325) and the second end 322. The traversing segment 327 is formed between the first bending portion 323 and the second bending portion 324, and an angle α between the traversing segment 327 and the top surface 21 of the sensor chip 2 can be controlled to be equal to or less than 15 degrees for reducing the maximum distance Dmax, thus lowering the possibility the wire 32 touches the light-permeable sheet 5.

It should be noted that the electrical connection member 3 in the present embodiment is illustrated with the above construction and conditions, but the electrical connection member 3 can be adjusted or changed according to design requirements and is not limited to the present embodiment. For example, in other embodiments not shown in the drawings of the present disclosure, the maximum distance Dmax can be set between the second bending portion 324 of the wire 32 and the substrate 1 (e.g., the first board surface 11); or, the wire 32 may lack the third bending portion 325; or, the wire 32 may also exclude the second bending portion 324, the third bending portion 325, and the traversing segment 327.

In addition, the second bending portion 324 of the wire 32 in the drawings of the present embodiment is arranged adjacent to the head solder 31, but the specific position of the second bending portion 324 can be adjusted or changed according to design requirements and is not limited to the present embodiment. For example, in other embodiments not shown in the drawings of the present disclosure, the wire 32 can be provided without the third bending portion 325, and the second bending portion 324 is arranged on a substantial center portion of the wire 32, so that the dropdown segment 328 can stretch from the second bending portion 324 to the corresponding soldering pad 112, and a length of the traversing segment 327 can be effectively increased.

The supporting adhesive layer 4 is formed on the top surface 21 of the sensor chip 2 and surrounds an outer side of the sensing region 22. The supporting adhesive layer 4 in the present embodiment is in an annular shape, and an outer lateral side of the supporting adhesive layer 4 does not exceed lateral sides of the sensor chip 2 along the top surface 21 of the sensor chip 2. For each of the electrical connection members 3, the head solder 31 and a portion of the wire 32 are embedded in the supporting adhesive layer 4, and the portion of the wire 32 embedded in the supporting adhesive layer 4 has a highest point that is spaced apart from the substrate 1 by the maximum distance Dmax. Furthermore, the highest point of the wire 32 is spaced apart from the top surface 21 of the sensor chip 2 by a distance that is within a range from 50 μm to 100 μm.

Specifically, for each of the wires 32 of the present embodiment, the highest point is located at the first bending portion 323 (i.e., the peak of the first bending portion 323) and is embedded in the supporting adhesive layer 4, and the second bending portion 324 is arranged outside of the supporting adhesive layer 4. In other words, the portion of the wire 32 embedded in the supporting adhesive layer 4 in the present embodiment includes the first end 321, the drawing segment 326, the first bending portion 323, and at least part of the traversing segment 327. The present disclosure is not limited thereto, in other embodiments not shown in the drawings of the present disclosure, the second bending portion 324 of each of the wires 32 can be embedded in the supporting adhesive layer 4 and formed with the highest point.

Accordingly, the sensor package structure 100 of the present embodiment can be formed with a thinner thickness and a better reliability via a structural design of the electrical connection members 3 (e.g., the head solder 31 and the first bending portion 323 of each of the electrical connection members 3 are embedded in the supporting adhesive layer 4; or the portion of each of the wires 32 embedded in the supporting adhesive layer 4 has the highest point that is spaced apart from the substrate 1 by the maximum distance Dmax; or each of the wires 32 has the first bending portion 323 adjacent to the head solder 31 and the second bending portion 324 that is arranged between the first bending portion 323 and the second end 322).

The light-permeable sheet 5 in the present embodiment is a transparent flat glass, but the present disclosure is not limited thereto. The light-permeable sheet 5, the supporting adhesive layer 4, and the top surface 21 of the sensor chip 2 jointly define an enclosed space S. In other words, the supporting adhesive layer 4 is sandwiched between the light-permeable sheet 5 and the top surface 21 of the sensor chip 2, and the sensing region 22 is arranged in the enclosed space S and faces toward the light-permeable sheet 5.

The package body 6 is formed on the first board surface 11 of the substrate 1. The sensor chip 2, the tail solder 33 of each of the electrical connection members 3, a portion of the wire 32 arranged outside of the supporting adhesive layer 4 of each of the electrical connection members 3 (e.g., the second bending portion 327, the dropdown segment 328, the second end 322, and a portion of the traversing segment 326), the supporting adhesive layer 4, and a portion of the light-permeable sheet 5 are embedded in the package body 6.

Furthermore, the package body 6 in the present embodiment is a solidified liquid compound, but the present disclosure is not limited thereto. For example, in other embodiments not shown in the drawings of the present disclosure, the package body 6 can be a molding compound; or, the package body 6 can include the solidified liquid compound and the molding compound that is formed on the solidified liquid compound.

Beneficial Effects of the Embodiment

In conclusion, the sensor package structure of the present disclosure can be formed with a thinner thickness and a better reliability via a structural design of the electrical connection members (e.g., the head solder and the first bending portion of each of the electrical connection members are embedded in the supporting adhesive layer; or, the portion of each of the wires embedded in the supporting adhesive layer has the highest point that is spaced apart from the substrate by the maximum distance; or, each of the wires has the first bending portion adjacent to the head solder and the second bending portion that is arranged between the first bending portion and the second end).

Moreover, in the sensor package structure of the present disclosure, the traversing segment is formed between the first bending portion and the second bending portion, so that the angle between the traversing segment and the top surface of the sensor chip can be controlled to be equal to or less than 15 degrees for reducing the maximum distance, thus lowering the possibility the wire touches the light-permeable sheet. Accordingly, reliability of the sensor package structure in the present disclosure can be further increased.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A sensor package structure, comprising:
   a substrate including a chip bonding region and a plurality of soldering pads that are arranged outside of the chip bonding region;
   a sensor chip disposed on the chip bonding region, wherein a top surface of the sensor chip has a sensing region and a plurality of connecting pads that are arranged outside of the sensing region;
   a plurality of electrical connection members respectively and electrically connecting the connecting pads to the soldering pads, wherein each of the electrical connection members includes:
   a head solder disposed on the corresponding connecting pad;
   a wire having a first end and a second end that is opposite to the first end, wherein the first end of the wire extends from the head solder so as to connect the second end onto the corresponding soldering pad, and the wire has a first bending portion arranged adjacent to the head solder; and
   a tail solder fixed to the second end of the wire and the corresponding soldering pad;
   a supporting adhesive layer formed on the top surface of the sensor chip and surrounding an outer side of the sensing region, wherein for each of the electrical connection members, the head solder and the first bending portion of the wire are embedded in the supporting adhesive layer; and
   a light-permeable sheet disposed on the supporting adhesive layer, wherein the light-permeable sheet, the supporting adhesive layer, and the top surface of the sensor chip jointly define an enclosed space.

2. The sensor package structure according to claim 1, wherein for each of the electrical connection members, the first bending portion of the wire is spaced apart from the substrate by a maximum distance.

3. The sensor package structure according to claim 1, wherein for each of the electrical connection members, the first bending portion is spaced apart from the top surface of the sensor chip by a distance that is within a range from 50 μm to 100 μm.

4. The sensor package structure according to claim 1, wherein for each of the electrical connection members, the wire has a second bending portion that is arranged between the first bending portion and the second end.

5. The sensor package structure according to claim 4, wherein for each of the electrical connection members, the wire has a traversing segment between the first bending portion and the second bending portion, and an angle between the traversing segment and the top surface of the sensor chip is equal to or less than 15 degrees.

6. The sensor package structure according to claim 1, further comprising a package body formed on the substrate, wherein the sensor chip, the tail solder of each of the electrical connection members, a portion of the wire arranged outside of the supporting adhesive layer of each of the electrical connection members, the supporting adhesive layer, and a portion of the light-permeable sheet are embedded in the package body.

7. A sensor package structure, comprising:
   a substrate including a chip bonding region and a plurality of soldering pads that are arranged outside of the chip bonding region;
   a sensor chip disposed on the chip bonding region, wherein a top surface of the sensor chip has a sensing region and a plurality of connecting pads that are arranged outside of the sensing region;
   a plurality of electrical connection members respectively and electrically connecting the connecting pads to the soldering pads, wherein each of the electrical connection members includes:
   a head solder disposed on the corresponding connecting pad;
   a wire having a first end and a second end that is opposite to the first end, wherein the first end of the wire extends from the head solder so as to connect the second end onto the corresponding soldering pad; and
   a tail solder fixed to the second end of the wire and the corresponding soldering pad;
   a supporting adhesive layer formed on the top surface of the sensor chip and surrounding an outer side of the sensing region, wherein for each of the electrical connection members, the head solder and a portion of the wire are embedded in the supporting adhesive layer, and the portion of the wire has a highest point that is spaced apart from the substrate by a maximum distance; and a light-permeable sheet disposed on the supporting adhesive layer, wherein the light-permeable sheet, the supporting adhesive layer, and the top surface of the sensor chip jointly define an enclosed space.

8. The sensor package structure according to claim 7, wherein for each of the electrical connection members, the highest point of the wire is spaced apart from the top surface of the sensor chip by a distance that is within a range from 50 μm to 100 μm.

9. A sensor package structure, comprising:
a substrate including a chip bonding region and a plurality of soldering pads that are arranged outside of the chip bonding region;
a sensor chip disposed on the chip bonding region, wherein a top surface of the sensor chip has a sensing region and a plurality of connecting pads arranged outside of the sensing region;
a plurality of electrical connection members respectively and electrically connecting the connecting pads to the soldering pads, wherein each of the electrical connection members includes:
a head solder disposed on the corresponding connecting pad;
a wire having a first end and a second end that is opposite to the first end, wherein the first end of the wire extends from the head solder so as to connect the second end onto the corresponding soldering pad, and the wire has a first bending portion arranged adjacent to the head solder and a second bending portion that is arranged between the first bending portion and the second end; and
a tail solder fixed to the second end of the wire and the corresponding soldering pad;
a supporting adhesive layer formed on the top surface of the sensor chip and surrounding an outer side of the sensing region, wherein for each of the electrical connection members, the head solder and a portion of the wire are embedded in the supporting adhesive layer; and
a light-permeable sheet disposed on the supporting adhesive layer, wherein the light-permeable sheet, the supporting adhesive layer, and the top surface of the sensor chip jointly define an enclosed space.

10. The sensor package structure according to claim 9, wherein for each of the electrical connection members, the wire has a traversing segment between the first bending portion and the second bending portion, and an angle between the traversing segment and the top surface of the sensor chip is equal to or less than 15 degrees.

* * * * *